United States Patent
Burgermeister

(10) Patent No.: US 10,389,264 B2
(45) Date of Patent: Aug. 20, 2019

(54) POWER CONVERTER

(71) Applicant: Schmidhauser AG, Romanshorn (CH)

(72) Inventor: Andreas Burgermeister, Mauren (CH)

(73) Assignee: Schmidhauser AG, Romanshorn (CH)

( * ) Notice: Subject to any disclaimer, the term of this patent is extended or adjusted under 35 U.S.C. 154(b) by 0 days.

(21) Appl. No.: 14/901,432

(22) PCT Filed: Jun. 27, 2014

(86) PCT No.: PCT/EP2014/063684
§ 371 (c)(1),
(2) Date: Dec. 28, 2015

(87) PCT Pub. No.: WO2014/207195
PCT Pub. Date: Dec. 31, 2014

(65) Prior Publication Data
US 2016/0373018 A1    Dec. 22, 2016

(30) Foreign Application Priority Data
Jun. 28, 2013  (DE) .......... 10 2013 212 764

(51) Int. Cl.
*H02H 7/08* (2006.01)
*H02M 7/00* (2006.01)
(Continued)

(52) U.S. Cl.
CPC .......... *H02M 7/003* (2013.01); *G01R 31/025* (2013.01); *G01R 31/34* (2013.01); *H02M 1/00* (2013.01);
(Continued)

(58) Field of Classification Search
CPC .......... H02M 7/003; H02M 2001/0009; G01R 31/025; G01R 15/181; H02P 27/04; H05K 1/0296
(Continued)

(56) References Cited

U.S. PATENT DOCUMENTS

| 4,520,417 A | 5/1985 | Frank |
| 6,118,270 A | 9/2000 | Singer et al. |

(Continued)

FOREIGN PATENT DOCUMENTS

| CN | 101622149 A | 1/2010 |
| CN | 101911462 A | 12/2010 |

(Continued)

OTHER PUBLICATIONS

International Search Report (PCT/ISA/210) issued in PCT Application No. PCT/EP2014/063684 dated Dec. 1, 2014 with English translation (Six (6) pages).

*Primary Examiner* — Muhammad S Islam
(74) *Attorney, Agent, or Firm* — Crowell & Moring LLP

(57) ABSTRACT

A power converter for driving a three-phase AC motor with three phase conductors has: a first terminal for connecting a first of the three phase conductors of the three-phase AC motor, wherein a current which is to be output by way of the first terminal is routed to the first terminal by way of an electrical feed line, and a ground-fault and/or short-circuit identification circuit which is designed to detect a ground fault and/or short circuit of the first terminal. The ground-fault and/or short-circuit identification circuit has: a coil with a winding which is arranged adjacent to the electrical feed line, wherein the winding does not surround the electrical feed line, and an evaluation device which is designed to evaluate a voltage, which is induced in the winding, for ground-fault and/or short-circuit identification.

9 Claims, 1 Drawing Sheet

(51) Int. Cl.
*G01R 31/02* (2006.01)
*G01R 31/34* (2006.01)
*H02M 1/00* (2006.01)
*H02P 27/04* (2016.01)
*H05K 1/02* (2006.01)
*G01R 15/18* (2006.01)

(52) U.S. Cl.
CPC ........... *H02P 27/04* (2013.01); *H05K 1/0296* (2013.01); *G01R 15/181* (2013.01); *H02M 2001/0009* (2013.01)

(58) Field of Classification Search
USPC ........................................................ 361/230
See application file for complete search history.

(56) References Cited

U.S. PATENT DOCUMENTS

| | | |
|---|---|---|
| 8,269,451 B2 | 9/2012 | Kitanaka |
| 8,310,242 B2 | 11/2012 | Itten et al. |
| 8,410,745 B2 | 4/2013 | Hosoda et al. |
| 9,007,790 B2 | 4/2015 | Dillig et al. |
| 2003/0112000 A1* | 6/2003 | Sorenson, Jr. ....... G01R 15/181 324/126 |
| 2003/0155928 A1* | 8/2003 | Roden ................... B60L 3/0061 324/509 |
| 2003/0184931 A1* | 10/2003 | Morris ................. H02H 11/005 361/42 |
| 2005/0227820 A1* | 10/2005 | Dyer ................... A63B 22/0023 482/54 |
| 2011/0050154 A1* | 3/2011 | Farr ....................... H02J 3/006 318/778 |
| 2011/0058391 A1 | 3/2011 | Ueno |
| 2012/0074929 A1 | 3/2012 | Wobschall |
| 2013/0057267 A1* | 3/2013 | Klein ................... G01R 15/185 324/234 |
| 2013/0229192 A1* | 9/2013 | Behringer ............. G01R 11/02 324/658 |

FOREIGN PATENT DOCUMENTS

| | | |
|---|---|---|
| CN | 102013822 A | 4/2011 |
| DE | 199 58 938 A1 | 6/2001 |
| EP | 0 121 990 A1 | 10/1984 |
| EP | 1 909 368 A2 | 4/2008 |
| EP | 2 568 560 A1 | 3/2013 |
| FR | 2 980 581 A1 | 3/2013 |
| WO | WO 2011/018530 A1 | 2/2011 |

\* cited by examiner

POWER CONVERTER

BACKGROUND AND SUMMARY OF THE INVENTION

The invention relates to a power converter, in particular in the form of an inverter or a frequency converter.

In power converters, it is often necessary to detect a ground fault and/or short circuit at one or more terminals in order to establish a safe state, for example to interrupt a voltage or current output at the terminal in question, when a ground fault or short circuit is detected.

The invention is based on the object of providing a power converter comprising ground-fault and/or short-circuit identification which is simple to implement, cost-effective and/or space-saving.

The invention achieves this object by way of a power converter for driving a three-phase AC motor having three phase conductors, comprising: a first terminal for connecting a first of the three phase conductors of the three-phase AC motor, wherein a current which is to be output by way of the first terminal is routed to the first terminal by way of an electrical feed line; and a ground-fault and/or short-circuit identification circuit which is designed to detect a ground fault and/or short circuit of the first terminal, comprising: a coil having a winding which is arranged adjacent to the electrical feed line, wherein the winding does not surround the electrical feed line, and an evaluation device which is designed to evaluate a voltage, which is induced in the winding, for ground-fault and/or short-circuit identification. Embodiments of the invention are described and claimed herein.

The power converter, in particular a power converter in the form of an inverter or frequency converter, serves to drive a conventional three-phase AC motor which has, for example, one phase conductor or phase terminal for each phase. A respective phase conductor can form a so-called strand. Moreover, reference is also made to the relevant technical literature in this respect.

A power converter is understood to mean an apparatus for converting an electrical signal into another electrical signal, wherein, for example, a signal amplitude and/or a signal frequency is converted during the conversion process. This conversion is generally performed by means of electronic components, such as transistors, in particular in the form of IGBTs or MOSFETs, diodes or thyristors. Moreover, reference is also made to the relevant technical literature in this respect.

The power converter has a first terminal for connecting a first phase conductor of the three phase conductors of the three-phase AC motor or the associated terminal of the three-phase AC motor, wherein a current which is to be output or is output by means of (over) the first terminal is routed to the first terminal by means of an electrical feed line, for example in the form of an electrically conductive cable or a conductor track of a printed circuit board, within the power converter.

The power converter further has a ground-fault and/or short-circuit identification circuit which is designed to detect a ground fault and/or short circuit of the first terminal.

The ground-fault and/or short-circuit identification circuit has a coil with a winding. The winding is preferably arranged or positioned adjacent to the electrical feed line in such a way that a change in current in the electrical feed line induces a voltage, which can be measured by means of conventional components, in the coil or the winding of said coil. The winding is arranged in such a way that it does not physically surround or does not physically enclose the electrical feed line, in contrast to the principle of a conventional current transformer. In other words, the electrical feed line does not pass through the winding, as is the case in a conventional current transformer. Furthermore, the coil is not electrically looped-in between the first terminal and the electrical feed line. In addition, the first terminal preferably does not have an associated shunt resistor for current measurement.

The ground-fault and/or short-circuit identification circuit further has an evaluation device which is designed to evaluate a voltage, which is induced in the winding, for ground-fault and/or short-circuit identification. The evaluation device can have, for example, an evaluation electronics system or be embodied as an evaluation electronics system which generates a signal as soon as the induced voltage exceeds a threshold value which can be prespecified or is prespecified, that is to say a change in current, preferably an increase in current, in the electrical feed line exceeds an amount which can be prespecified.

The power converter can have a second terminal for connecting a second of the three phase conductors or the associated terminal of the three-phase AC motor, and a third terminal for connecting a third of the three phase conductors or the associated terminal of the three-phase AC motor.

Furthermore, the power converter can have a first current sensor, for example in the form of a conventional current transformer or a shunt resistor, which is designed to measure a current which is output at the second terminal.

Furthermore, the power converter can have a second current sensor, for example in the form of a conventional current transformer or a shunt resistor, which is designed to measure a current which is output at the third terminal.

The power converter preferably has precisely one ground-fault and/or short-circuit identification circuit and precisely two current sensors. In this way, conventional ground-fault and/or short-circuit identification can be carried out at the second and third terminals by means of the conventional current sensors. Ground-fault and/or short-circuit identification can be carried out by means of the ground-fault and/or short-circuit identification circuit at the first terminal in a highly space-saving and cost-effective manner in comparison to a conventional dedicated current sensor, without a conventional current sensor, for example in the form of a transformer, having to be provided for this purpose.

The winding or the turns can be formed by at least one winding-forming conductor track on a printed circuit board. The winding or the turns can be formed by conductor tracks on different layers of the printed circuit board, wherein, for example, in each case three turns of the winding can be provided on four layers, said three turns being electrically connected to one another, for example, by means of plated-through holes, so that a coil with a total of twelve turns is formed.

The electrical feed line can likewise be formed as one or more conductor tracks on the printed circuit board, wherein, for the purpose of electrical insulation between the electrical feed line and the winding, the electrical feed line can be arranged on one or more layers of the printed circuit board which are different from the layer or the layers on which the conductor tracks which form the winding of the coil are arranged.

The coil can be formed from a plurality of electrically coupled coil elements. By way of example, a first of the coil elements can be arranged on a first side of the electrical feed line, and a second of the coil elements can be arranged on a second side of the electrical feed line, which second side is situated opposite the first side.

BRIEF DESCRIPTION OF THE DRAWINGS

The invention will be described in detail below with reference to the drawings, in which.

DETAILED DESCRIPTION OF THE DRAWINGS

Figure 1:
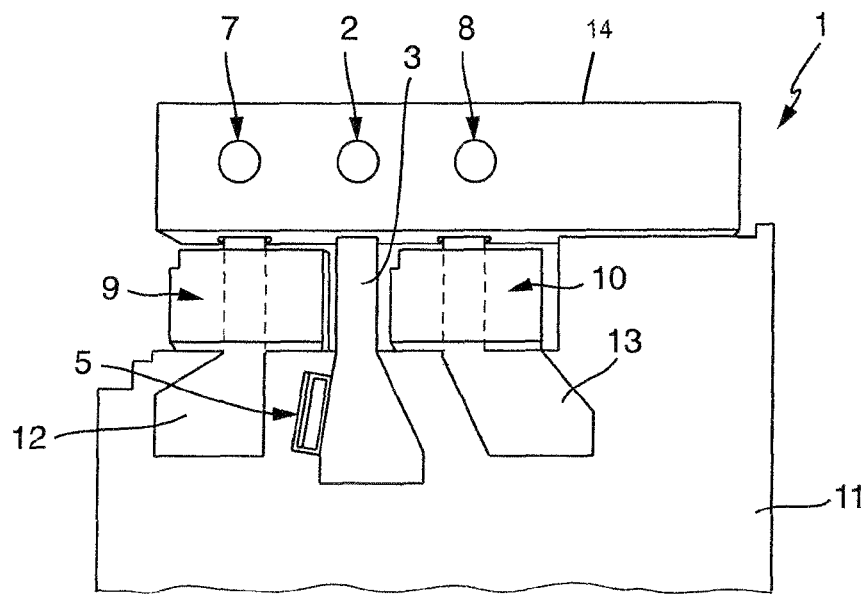
FIG. 1 schematically shows a power converter in the form of a frequency converter for driving a three-phase AC motor, and FIG. 2 schematically shows a basic circuit diagram of an evaluation device for ground-fault and short-circuit identification of the frequency converter which is shown in FIG. 1.

FIG. 1 shows a power converter in the form of a frequency converter 1 for driving a conventional three-phase AC motor, not shown, with three phase conductors or three strands.

The frequency converter 1 conventionally has three terminals or outputs 2, 7 and 8 at terminal strip 14 for electrical connection to associated phase conductors or strands of the three-phase AC motor.

A current which is to be output by means of the first terminal 2 is routed to the first terminal 2 by means of an electrical feed line 3 which is formed as a conductor track on one or more layers of a multi-layer printed circuit board 11. Corresponding conductor tracks 12 and 13 serve as electrical feed lines to the terminals 7 and, respectively, 8.

A first current sensor in the form of a transformer 9 is designed to measure a current which is output at the second terminal 7.

A second current sensor in the form of a transformer 10 is designed to measure a current which is output at the third terminal 8.

The printed circuit board 11 has, in the region of the terminals 2, 7 and 8, three finger-like projections which lead to the terminals 2, 7 and, respectively, 8. The conductor tracks 3, 12 and, respectively 13 each run flat on one or more layers of the finger-like projections of the printed circuit board 11. The finger-like projections of the printed circuit board 11 which are associated with the conductor tracks 12 and 13 are conventionally surrounded by the transformers 9 and, respectively, 10.

The currents measured by means of the transformers 9 and 10 serve, amongst other things, for ground-fault and/or short-circuit identification at the terminals 7 and, respectively, 8. Furthermore, the measured currents can also serve for current/voltage regulation, torque regulation etc.

A coil 5 without a soft-magnetic core and with a winding with a total of twelve turns is arranged immediately laterally adjacent to the electrical feed line or conductor track 3, wherein the winding or the turns do not surround the electrical feed line or conductor track 3. The coil 5 forms an induction loop.

The turns of the coil 5 are formed by conductor tracks which run in a flat and spiral manner on the printed circuit board 11, wherein in each case three conductor tracks which run in a spiral manner are provided on an associated layer of the printed circuit board 11. Electrical contact between the conductor tracks of different layers is made by means of plated-through holes. A winding axis or turn axis is perpendicular to a plane which is formed by the printed circuit board 11.

Figure 2:
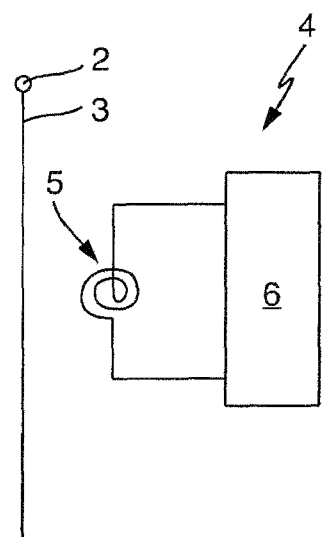

The coil 5 is a constituent part of a ground-fault and short-circuit identification circuit 4, as is illustrated as a basic circuit diagram in FIG. 2. The ground-fault and short-circuit identification circuit 4 has, in addition to the coil 5, an evaluation device or evaluation electronics system 6 which detects a ground fault and/or short circuit on the basis of a level of a voltage which is induced in the winding of the coil 5.

A sharp increase in current caused by a ground fault and/or short circuit in the electrical feed line 3 creates a high level of the induced voltage, so that, when a correspondingly selected threshold value of the induced voltage is exceeded, a ground fault and/or short circuit is detected.

An overcurrent which is caused by a ground fault can also be identified on the third phase, which is not provided with a conventional current measurement means, and then switched off by means of the invention in a frequency converter with conventional phase current measurement on 2 phases.

A ground fault or short circuit of a motor phase is identified by means of inductive coupling on a conductor, preferably in the form of a coil with one or more turns, wherein the induced voltage is evaluated for short-circuit and/or ground-fault identification. This is possible both in the form of a separate component or in the form of conductor tracks with one or more layers, wherein the coil is situated in the vicinity of the current conductor which is to be measured or the corresponding electrical feed line.

The coil can be constructed from a plurality of individual coils, for example to the left and to the right of the electrical feed line which is to be monitored. An electronics system for evaluating the induced voltage is connected downstream of said coil.

The invention claimed is:

1. A power converter for driving a three-phase AC motor having three phase conductors, comprising:
   a first terminal of the power converter arranged to output current to a first of the three phase conductors of the three-phase AC motor;
   a first conductor of the power converter, the first conductor being connected at a first end to the first terminal and at a second end to an electrical feed line supplying all three phase conductors of the three phase AC motor; and
   a ground-fault and/or short-circuit identification circuit which is designed to detect a ground fault and/or short circuit of the first terminal, the ground-fault and/or short-circuit identification circuit including
      a coil having a winding formed by at least one conductor track of a printed circuit board, the winding being arranged adjacent to the first conductor of the power converter at a location between the connection to the electrical feed line supplying current to the first conductor and the connection of the first conductor to the first terminal, wherein the winding does not surround the first conductor, and the winding is arranged such that a current flowing solely in the first conductor directly induces a voltage in the winding, and
      an evaluation device which is designed to evaluate the voltage, which is induced in the winding, for ground-fault and/or short-circuit identification.

2. The power converter as claimed in claim 1, further comprising:
   a second terminal of the power converter arranged to output current to a second of the three phase conductors, a third terminal of the power converter arranged to output current to a third of the three phase conductors,
a first current sensor which is designed to measure a current which is output at the second terminal, and
a second current sensor which is designed to measure a current which is output at the third terminal,
wherein the power converter has precisely one ground-fault and/or short-circuit identification circuit and precisely two current sensors.

3. The power converter as claimed in claim 1, wherein the winding is formed by conductor tracks on different layers of the printed circuit board.

4. The power converter as claimed in claim 1, wherein the first conductor connected to the first terminal is formed as a conductor track of the printed circuit board.

5. The power converter as claimed in claim 1, wherein the coil is formed from a plurality of coil elements.

6. The power converter as claimed in claim 2, wherein the winding is formed by at least one conductor track of a printed circuit board.

7. The power converter as claimed in claim 3, wherein the first conductor is connected to the first terminal is formed as a conductor track of the printed circuit board.

8. The power converter as claimed in claim 5, wherein a first of the coil elements is arranged on a first side of the first conductor connected to the first terminal, and a second of the coil elements is arranged on a second side of the first conductor, said second side being situated opposite the first side.

9. The power converter as claimed in claim 6, wherein the winding is formed by conductor tracks on different layers of the printed circuit board.

* * * * *